United States Patent [19]

Charlet et al.

[11] Patent Number: 5,047,115
[45] Date of Patent: Sep. 10, 1991

[54] PROCESS FOR ETCHING BY GAS PLASMA

[75] Inventors: Barbara Charlet, Meylan; Louise Peccoud, Claix, both of France

[73] Assignee: Commissariat a l'Energie Atomique, Paris, France

[21] Appl. No.: 439,392

[22] PCT Filed: May 31, 1988

[86] PCT No.: PCT/FR88/00272

§ 371 Date: Nov. 15, 1989

§ 102(e) Date: Nov. 15, 1989

[87] PCT Pub. No.: WO88/09830

PCT Pub. Date: Dec. 15, 1988

[30] Foreign Application Priority Data

Jun. 1, 1987 [FR] France .................. 87 07631

[51] Int. Cl.$^5$ ...................... H01L 21/306; B44C 1/22; C03C 15/00; C23F 1/00
[52] U.S. Cl. .................................... 156/643; 156/646; 156/656; 156/657; 156/659.1; 156/662; 156/345; 204/192.37; 252/79.1
[58] Field of Search ............... 156/643, 646, 656, 657, 156/659.1, 662, 345; 252/79.1; 204/192.32, 192.35, 192.37, 298; 427/38, 39

[56] References Cited

U.S. PATENT DOCUMENTS 4,579,623 4/1986 Suzuki et al. .................. 252/79.1 X
4,581,100 4/1986 Hatzakis et al. ..................... 156/345

FOREIGN PATENT DOCUMENTS 0115970 8/1984 European Pat. Off. .
0180020 5/1986 European Pat. Off. .
0212924 3/1987 European Pat. Off. .

OTHER PUBLICATIONS

Journal of the Electrochemical Society, vol. 132, No. 12, Dec. 1985, S. Adachi et al.: "Reactive Ion Etching of Tungsten Films Sputter Deposited on GaAs", pp. 2980-2989.
Microelectronic Engineering, vol. 3, No. 1, Dec. 1985, Elsevier Science Publishers B.V., J. Paraszczak et al.: "Methods of Creation and Effect of Microwave Plasmas Upon the Etching of Polymers and Silicon", pp. 397-410.

Primary Examiner—William A. Powell
Attorney, Agent, or Firm—Oblon, Spivak, McClelland, Maier & Fisher, P.C.

[57] ABSTRACT

The invention relates to a process for etching a substrate with the aid of a gas plasma produced either by ultra-high frequency waves, or by ultra-high frequency and radio-frequency waves.

In this process, the gaseous medium used for the formation of the plasma comprises at least one non-carbon-containing fluorinating gas such as $SF_6$, at least one rare gas such as Ar and at least one non-carbon-containing oxidizing gas such as oxygen, as well as optionally another gas such as nitrogen.

The invention is more particularly usable in the microelectronics field.

13 Claims, 1 Drawing Sheet

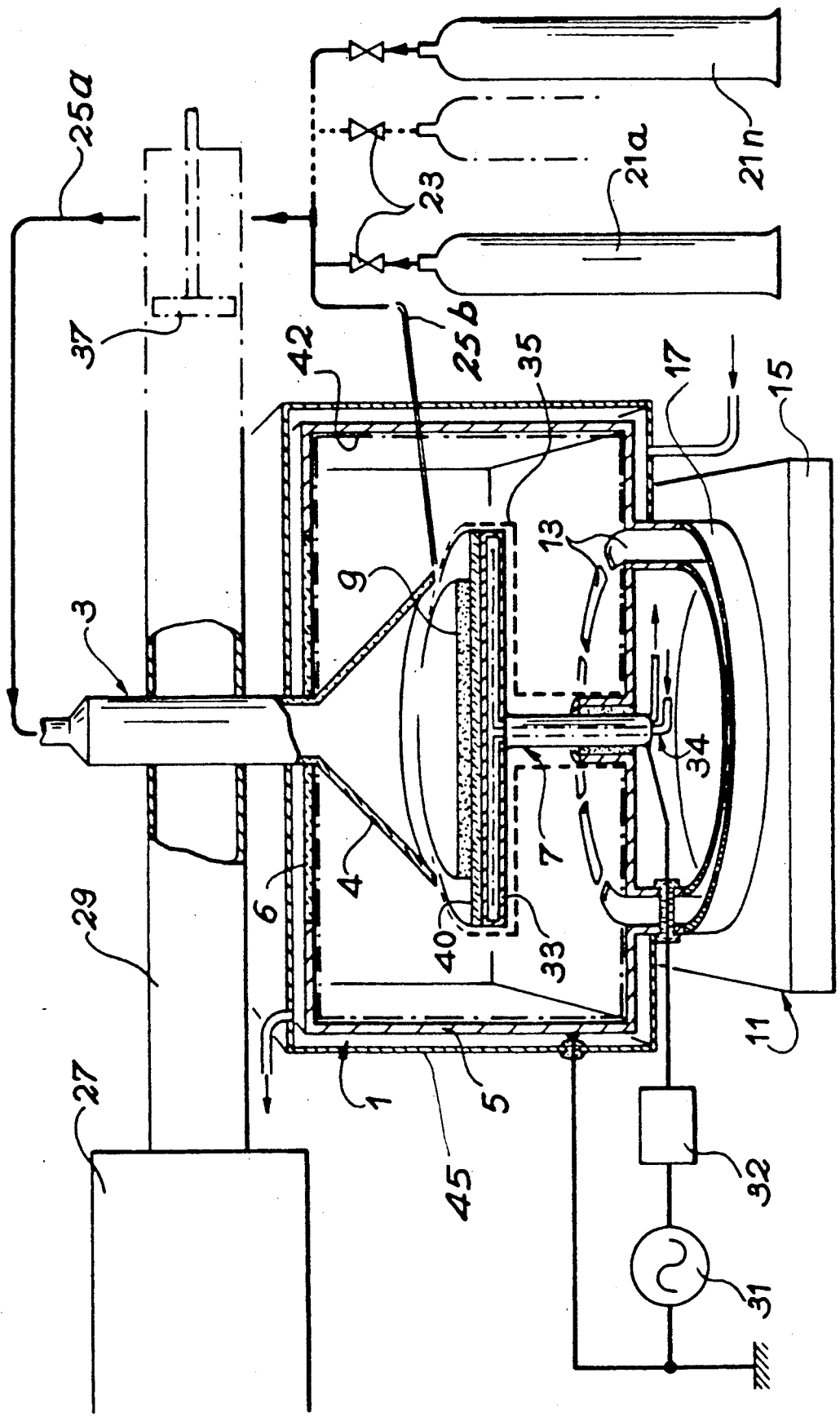

PROCESS FOR ETCHING BY GAS PLASMA

FIELD OF THE INVENTION

The present invention relates to a process for etching by plasma usable for etching layers of a random nature (insulating, condutive, semiconductive) on random substrates (conductors, semiconductors, insulants) and in particular for producing large relief structures in silicon.

The invention more particularly applies to the microelectronics field, especially for producing magnetic recording heads and hybrid circuits, as well as in the optronics and sensor fields.

In known manner, for producing etchings by plasma, said plasma is produced by reacting an appropriate gaseous medium with ultra-high frequency and/or radio-frequency waves. The interaction of the ultra-high frequency or radio-frequency waves with the gaseous medium makes it possible to split up the gaseous medium into ionized species (ions, electrons) and into neutral species (atoms, molecules). These different species constitute the plasma and initiate chemical reactions on the layer to be etched.

Thus, J. Electrochem. Soc., Vol. 132, December 1985 discloses an etching process using a plasma produced by radio-frequency waves, in which the gaseous medium is constituted by a fluorinating gas formed by $CF_4$ or $SF_6$, to which is optionally added argon, oxygen or nitrogen. This document demonstrates that the addition of oxygen is prejudicial for the selectivity of the etching, because it increases the etching rate of the mask and decreases the etching rate of the substrate, no matter what the fluorinating gas used. In addition, the gaseous medium recommended is a mixed $CF_4/N_2$ or $SF_6/N_2$ system.

An apparatus making it possible to produce a plasma by ultra-high frequency waves is e.g. described in French patent application FR-A-2 534 040 and an apparatus making it possible to create a plasma by ratio-frequency waves is e.g. described in French patent application FR-A-2 538 987.

U.S. Pat. No. 4,298,419 discloses a process for etching by plasma produced by ultra-high frequency waves, in which the gaseous medium is constituted by a mixture of $C_2F_6$ and $H_2$ an a.c. voltage in the radio-frequency field is applied to the substrate to be etched in order to obtain a high etching rate when the substrate is insulating or covered insulating or covered with an insultant. However, the etching rates obtained with this process remain low, below 0.1 $\mu m/min$. In this process, the plasma is produced by coupling between a waveguide and a gas column without a preferred direction and focussed onto the substrate by creating a magnetic field. For high values of this magnetic field cyclotron resonance of the electrons is obtained, which increases the dissociation of the plasma. This requires the use of relatively low pressures below 6.5 Pa (50 mTorr) and high pumping rates.

BACKGROUND OF THE INVENTION

EP-A-0 180 020 and Microelectronic Engineering, Vol. 3, No. 1, 1985, pp. 397–410 discloses plasma etching processes simultaneously using ultra-high frequencies and radio-frequencies with a gaseous medium chosen from among halogens, rare gases, etc., in the case of EP-A-0 180 020, or a mixture of $CF_4$ and oxygen in the case of the document.

These plasma etching processes simultaneously using ultra-high frequencies and radio-frequencies generally make it possible to obtain an improved result compared with that obtained with plasmas produced solely by radio-frequencies.

However, for producing deep structures in certain substrates, e.g. in silicon, in an industrial manner and with a good definition with respect to the geometry defined by the mask, it is necessary to further improve the results, particularly the etching speed or rate in order to have a high industrial production rate adapted to the etched depth and the control of the etched profile or anisotropy and the selectivity of the etching.

The characteristics of an etching made in a layer with the aid of a plasma are the speed or rate Vg, the anisotropy A and the selectivity S of the etching. The anisotropy of an eching A is determined by the ratio between the maximum width of the etching produced beneath the material constituting the mask of the etching and the depth of the etching. The smaller the anisotropy A, the more anisotropic the etching. The selectivity S of an etching corresponds to the ratio between the etching rate of the layer to be etched and the etching rate of the mask of the etching. The higher the selectivity S, the better the selectivity of the etching.

SUMMARY OF THE INVENTION

The present invention specifically relates to an etching process making it possible to obtain improved results, particularly with regards to the etching rate, the selectivity and the anisotropy, as a result of the choice of an appropriate gaseous medium.

The inventive process for etching a substrate with the aid of a gaseous or gas plasma produced either by ultra-high frequency waves, or by radio-frequency and ultra-high frequency waves is characterized in that the gaseous medium used for forming the plasma comprises at least one non-carbon-containing fluorinating gas, at least one rare gas, at least one non-carbon-containing oxidizing gas and optionally at least one other gas chosen from among nitrogen and chlorine containing gases, e.g. chlorine.

As a result of the choice of such a gaseous medium, not only is a highly dissociated plasma obtained, but also a plasma which is very rich in reactive species. Moreover, by regulating the composition of this medium, it is possible to adapt its capacities to the requirements of deep etching.

DESCRIPTION OF THE PREFERRED EMBODIMENTS

In this medium, the non-carbon-containing fluorinating gas which can be used can e.g. be sulphur hexafluoride $SF_6$. It is also possible to use nitrogen trifluoride $NF_3$. Thus, the use of these fluorine-containing gases makes it possible to obtain a plasma which is highly dissociated and very rich in reactive species. $NF_3$ can wholly or partly replace the sulphur hexafluoride, because it fulfils the same function as the latter as a fluorine-supplying reactive gas for etching and the nitrogen resulting from $NF_3$ decomposition is compatible with the etching process.

The rare gases which can be used can e.g. be helium, argon, neon and krypton. The rare gas or mixture of rare gases used ensures the stability of the discharge and its extension to the substrate.

Thus, the dissociation of a rare gas leads to ionized and neutral species with a long life, which makes it possible to maintain for a certain time the discharges caused by the ultra-high frequency waves optionally associated with radio-frequency waves. In general, use is made of argon or a mixture of argon and helium.

Thus, helium, which like argon, ensures the stability of the reactive plasma with regards to the plasma propagation and the energy transfer to the reactive species, reduces the temperature of the substrate compared with that obtained in the argon plasma alone, whilst ensuring a better calorie transfer into the medium. Thus, the thermal conductivity of helium at temperatures above 100° C. is much higher than that of argon.

The oxidizing gas which can be used is in particular oxygen, which stimulates the formation of volatile products following the decomposition of the fluorinating gas and following the reaction of these radicals with the surface of the substrate to be etched. It is possible to use other non-carbon-containing oxidizing gases, e.g. $N_2O$, which will decompose into nitrogen and oxygen, nitrogen being compatible with the etching process.

A gaseous mixture containing solely a non-carbon-containing fluorinating gas such as $SF_6$, a rare gas such as argon and an oxidizing gas such as oxygen makes it possible to obtain a high reactivity of the discharge, even when the latter is produced solely by ultra-high frequencies. Thus, when using this process for etching silicon, it is possible to obtain a silicon etching rate of at least 10 $\mu$m/min, a very high selectivity with respect to the $SiO_2$ mask greater than 100 and an etched depth uniformity better than 95%.

Moreover, the etching rate or speed is independent of the crystal orientation of the silicon $Si<100>$ or $<111>$, as well as the type of doping and the dopant dose of the silicon and it is possible to pass through a substrate with a thickness exceeding 500 $\mu$m. Moreover, a controllable or isotropic etching profile with an alpha angle between 50° and 70° is obtained, a surface state with a very limited roughness for significant etching depths and a silicon surface and of the $SiO_2$ mask without any parasitic polymer deposition.

When using this gaseous mixture with a mixed ultra-high frequency and radio-frequency excitation plasma on a silicon substrate, the etching speed is substantially the same, namely approximately 8 $\mu$m/min, the selectivity relative to the $SiO_2$ mask is approximately 80 and the etched depth uniformity is 95%.

In the same way, the etching rate is independent of the crystal orientation of the silicon, the type of doping and the dopant dose. It is possible to pass through a substrate thicker than 500 $\mu$m. A controllable alpha angle etching profile between 60° and 90° is obtained, i.e. a profile gain compared with the ultra-high frequency plasma. The surface state has a very limited roughness below 0.1 $\mu$m and there is no deposition of parasitic polymers on the surface of the silicon and the mask.

These results are due to the choice of a gaseous medium simultaneously incorporating a fluorinating gas, an oxidizing gas and a rare gas. On using a plasma for etching obtained from only one of these gases, all the advantages referred to hereinbefore, such as the etching rate, selectivity, uniformity and surface quality would not be obtained.

According to a variant of the invention, which can be used for etching a substrate by a gaseous plasma produced either by ultra-high frequencies, or by ultra-high and radio-frequencies, the gaseous mixture formed from the non-carbon-containing fluorinating gas or gases, the rare gas or gases and the non-carbon-containing oxidizing gas or gases also comprises another gas for influencing the etching results.

This gas can be nitrogen, which makes it possible to improve the surface state of the etched layer leading to a 30% roughness reduction, whilst also improving the etching homogeneity by approximately 10%. The effect of the nitrogen can be attributed to its function in the discharge as a producer of species with a long life and low energy permitting a greater effectiveness and a greater homogeneity of the discharge of the reactive products.

The added gas can be a chlorine-containing gas such as chlorine, which makes it possible to improve the profile of the etched patterns, particularly in the case where the plasma is solely produced by ultra-high frequencies, the alpha angle passing between 60° and 80° instead of 50° and 70°. The intervention of the chlorine on the alpha angle of the etching profile can be explained by the formation of non-volatile intermediate products of type $SiCl_x$ with $x \leq 3$, by absorption stages of the chlorine on the surface of the silicon and then by the formation of a relatively stable product. This process in particular develops on the walls of etched patterns receiving less direct ion bombardment from the plasma compared with the bottom of the etching. In the case where the etching is performed with a plasma produced by ultra-high frequencies and radio-frequencies, the ion bombardment phenomena are increased by the existence of a sheath level with the substrate, which aids the bombardment perpendicular to the bottom of the etching. As a result of this bias, etched profiles close to 90° are obtained.

When, according to the invention, a substrate is etched by means of a gas plasma produced by ultra-high frequencies and radio-frequencies, on the substrate confinement takes place by a cell made from a material transparent to the ultra-high frequency waves, of a gas plasma produced by transverse monomode coupling between a waveguide traversed by ultra-high frequency waves and the cell in which at least part of the etching gaseous medium circulates perpendicular to the ultra-high frequency waves for being directed onto the substrate and simultaneous application takes place to the substrate of a d.c. or a.c. voltage with a frequency in the radio-frequency range.

This plasma etching process simultaneously using ultra-high frequencies and radio-frequencies makes it possible to obtain a great effectiveness of the dissociation of the gases in the vicinity of the substrate to be etched, because the dissociation efficiency is directly linked with the electron density of the plasma, which is approximately 100 times higher in this case than in a discharge induced in the same gas by a radio-frequency device.

However, the process according to the invention also makes it possible to obtain good results with a gas plasma produced solely by ultra-high frequencies. In this case, confinement takes place on the substrate by a cell of a material transparent to the ultra-high frequency waves of a gas plasma produced by monotransverse coupling between a waveguide traversed by ultra-high frequency waves and the cell in which at least part of the etching gaseous medium flows perpendicular to the ultra-high frequency waves to be directed onto the substrate.

In both cases, etching takes place under a pressure of 0.1 to 300 Pa and preferably 1 to 100 Pa. In both cases, when the gaseous medium is formed by three gases such as $SF_6$, Ar and $O_2$, the respective flow rates of these three gases are in the following ranges:

4–500 cm$^3$ standard/min for $SF_6$,
4–500 cm$^3$ standard/min for Ar,
2–500 cm$^3$ standard/min for $O_2$, i.e. pressures of:

0.27 to 67.5 Pa,
0.27 to 135 Pa,
0.13 to 67.5 Pa, which corresponds to a total pressure of 0.67 to 270 Pa.

When the gaseous medium is formed by four gases such as $SF_6$, Ar, $O_2$ and $N_2$, the respective flow rates of these gases are in the following ranges:

4–500 cm$^3$ standard/min for $SF_6$,
4–500 cm$^3$ standard/min for Ar,
1–300 cm$^3$ standard/min for $O_2$,
1–300 cm$^3$ standard/min for $N_2$, i.e. pressures of:

0.27 to 67.5 Pa for $SF_6$,
0.27 to 135 Pa for Ar,
0.13 to 67.5 Pa for $O_2$, and
0.13 to 67.5 Pa for $N_2$, which corresponds to total pressures of 0.53 to 270 Pa.

It is pointed out that within the scope of the present invention a substrate is understood to be both the material alone and a superimposition of layers of different materials, etching in this case being performed on the final layer, which may or may not be protected by a mask. Preferably, the cell made from the material transparent to the ultra-high frequency waves issues above the substrate by means of a flared or widened part.

Thus, when using a gas plasma produced by ultra-high frequencies and radio-frequencies, it is possible to obtain high etching rates, particularly when the substrate or the upper surface thereof is a conductive or semiconducting material, e.g. polycrystalline silicon.

This is in particular due to the way in which the plasma is created and confined. Thus, through using a propagative plasma directed onto the substrate by a cell made from a material transparent to the electromagnetic rays issuing onto the substrate by a flared part, makes it possible to confine the plasma on the substrate and operate at pressures higher than those used in U.S. Pat. No. 4,298,419. By operating at higher pressures, it is possible to obtain higher gas flow rates, e.g. 100 cm$^3$ standard/min and thus create more reactive species, which makes it possible to increase the etching rate by a factor of 10. Thus, with the process according to the invention operating under a pressure of 13.5 Pa, it is possible to reach a silicon etching rate of at least 15 $\mu$m/min, whereas in the process of U.S. Pat. No. 4,298,419 it is only possible to obtain silicon etching rates of approximately 0.015 $\mu$m/min.

In the process according to the invention, as a result of the propagation mode of the microwave plasma and the coupling mode between the plasma and the ultra-high frequency wave, the application of an a.c. or d.c. voltage to the substrate makes it possible to improve the profile of the etching.

The application of an a.c. voltage to the substrate creates in the vicinity of the latter a sheath opposing the arrival of reactive species of the microwave plasma and consequently reduces the selectivity and etching rate of a semiconductor material such as silicon, whilst increasing the anisotropy of the etching profile.

In the process of the aforementioned U.S. Patent, when the substrate is of an insulating material or has a surface insulating layer, e.g. of $SiO_2$, a higher etching rate is obtained than in the case of silicon, whereas a reverse phenomenon is obtained with the process according to the invention on operating at a pressure of approximately 10 Pa, because in this case the etching rate of the silicon dioxide is lower than that of silicon.

In the process according to the invention, the ultra-high frequency waves are coupled with the plasma within the cell made from a material transparent to ultra-high frequency waves. Thus, an equilibrium is created between the plasma, which has its own energy characteristics, and the ultra-high frequency waves. The latter are transmitted directly to the plasma via the waveguide and the cell. Moreover, there is no need to use a magnetic field for strongly ionizing the gaseous medium.

In the process of the aforementioned U.S. Patent, the ultra-high frequency waves produce the medium excited at the end of their propagation lines located on the discharge chamber and the presence of the magnetic field makes it possible to confine the dissociated species on the substrate in order to avoid their recombination on the walls of the discharge chamber.

Thus, with the process according to the invention, it is possible to obtain a better silicon etching selectivity compared with a $SiO_2$ mask and, for obtaining a given profile, it is possible to have a better etching rate (at least 10 $\mu$m/min) and a better selectivity, generally higher than 100 when operating under 10 Pa.

The process according to the invention e.g. makes it possible to etch insulating materials, such as organic materials (polyimides, resins, etc.), semiconductor materials such as polycrystalline, monocrystalline or amorphous silicon, III–V compounds and conductive materials such as tungsten, molybdenum, tantalum, niobium, titanium and their silicides.

The process according to the invention makes it possible to obtain a compromise between the selectivity S, the rate Vg and the anisotropy A of the etching obtained with plasmas produced either by ultra-high frequency waves or by radio-frequency waves. The process according to the invention makes it possible to improve the rate Vg and selectivity S of a process for etching by a plasma produced by radio-frequency waves, whilst retaining a good anisotropy A of the etching. Therefore the inventive process is of particular interest for producing deep etchings, such as e.g. for producing magnetic recording heads.

For realizing the process according to the invention with a plasma produced by ultra-high frequency and radio-frequency waves, the ultra-high frequency and radio frequency waves are established independently of one another. The radio-frequency waves initiate the creation of the plasma and consequently enable to ultra-high frequency waves to be coupled with the plasma in order to also contribute to the creation of the latter.

So that there is no parasitic interaction between the ultra-high frequency waves and the radio-frequency waves, the interaction of the ultra-high frequency waves with the gaseous medium takes place at a distance from the interaction of the radio-frequency waves with the gaseous medium. This distance is e.g. approximately 7 cm. The distance between the two interaction types makes it possible not to disturb the propagation of the ultra-high frequency and radio-frequency waves and to ensure a good superimposition thereof in the gaseous medium.

The frequency of the ultra-high frequency waves is e.g. between 0.2 and 9 GHz and that of the radio-frequency waves between 0.02 and 15 MHz.

Other features and advantages of the invention can be gathered from the following purely illustrative and non-limitative description with reference to the attached drawing showing an embodiment of an apparatus making it possible to perform the inventive process.

BRIEF DESCRIPTION OF THE DRAWINGS

This drawing shows an enclosure 1 constituted by a cell 3 made from a material transparent to ultra-high frequency waves and a cavity 5 made from a conductive material, which may or may not be transparent to ultra-high frequency waves. When cavity 5 is made from a conductive material, the part 6 of said cavity in the vicinity of cell 3 is made from an insulating material, e.g. quartz. The inner part 4 of the cell issues into the upper part of the cavity by means of a flared or widened portion. The cell is e.g. made from quartz, whilst the cavity is e.g. made from aluminium or stainless steel.

Within the cavity is provided a support 7 able to receive one or more substrates to be etched. For reasons of simplicity, only one substrate 9 is shown on the support and it is made from a single material corresponding to the layer to be etched. The widened portion 4 of the cell faces the substrate 9, the opening of said portion having dimensions which are a function of those of the substrate 9.

The said apparatus comprises means for introducing a gaseous medium into the enclosure. These means comprise several gas reservoirs 21a–21n containing different gases and connected by flow regulating valves 23 and a duct 25a to the upper part of cell 3. There can also be different ducts for separately introducing the gases at different points of the cell, e.g. for introducing the fluorine-containing reactive gas at the substrate via duct 25b and for introducing the rare gas an $O_2$ in the upper part of said cell 3.

The apparatus also comprises pumping means 11, which can make it possible to establish a vacuum in the enclosure and to circulate or not circulate the gaseous medium introduced into the enclosure and extract the gaseous medium resulting from the chemical reactions in the enclosure. Means 11 are connected to the lower part of cavity 5 by a discontinuous annular slot 13 located in the lower wall thereof and centered on support 7. These pumping means e.g. comprise a pump 15 tightly connected by a toroidal duct 17 to the slot located in the cavity.

The apparatus shown in the drawing also comprises means for producing ultra-high frequency waves in enclosure 1. These means comprise a first ultra-high frequency wave generator 27 connected by a waveguide 29 with a rectangular cross-section to the cell having a circular cross-section. Thus, the walls associated with the large sides of the waveguide have a circular opening permitting the passage of the cylindrical cell through the waveguide.

The cross-sectional dimensions of the waveguide are chosen as a function of the frequencies of the ultra-high frequency waves used. At one of the ends of the waveguide opposite to the ultra-high frequency wave generator is installed a piston 37 integral with a rod making it possible to manually or automatically slide the piston over a certain length. This length is preferably roughly the same as the wavelength of the waveguide propagation mode. This piston makes it possible to regulate the length of the waveguides in order to permit, as shown hereinbefore, a maximum, constant absorption of the power of the ultra-high frequency waves transmitted to the gaseous medium by the waveguide. An example of coupling a waveguide with a gas cell usable in the apparatus according to the invention is e.g. described in French Patents 2 534 040, 2 290 126 and 2 346 939, as well as U.S. Pat. No. 4,049,940.

The apparatus also comprises means for producing radio-frequency waves in the enclosure. These means comprise a radio-frequency wave generator 31 connected on the one hand to a radio-frequency electrode 33 and on the other to a counterelectrode connected to earth or ground. Electrode 33 is constituted by part of the support 7. Thus, support 7 comprises electrode 33 and a plate 40 made from an insulating material, such as quartz located on electrode 33. By raising substrate 9, said plate makes it possible to reduce the sheath phenomena. The radio-frequency waves interact with the gaseous medium of the enclosure in the vicinity of the support.

The counterelectrode is also constituted by the conductive walls of the cavity, but can also be constituted by a supplementary electrode 35 (shown in dotted line form) located around electrode 33 and in the vicinity thereof, or by the walls of the cavity and the supplementary electrode. When a supplementary electrode is used, the latter is e.g. directly connected to the conductive walls of the cavity connected to earth and located at a limited distance from electrode 33.

In order to regulate the power of the radio-frequency waves, so as to obtain a maximum, constant absorption of the power of said waves in the gaseous medium, as stated hereinbefore, use is made of a tuning box 32 connected between the radio-frequency wave generator 31 and the radio-frequency electrode 33.

Moreover, a cooling circuit 34 ensures a circulation of a cooling liquid within the electrode 33, so as to cool substrate 9.

The said apparatus can also comprise not shown means for regulating the height of support 7 and therefore substrate 9 relative to the plasma created by the ultra-high frequency waves in the cell and relative to the opening of the widened portion of said cell, in such a way that the interaction of the ultra-high frequency waves with the gaseous medium and the interaction of the radio-frequency waves with the gaseous medium do not disturb the propagation of these two plasma types.

There are also sealing means between the cell and the reactor, between the reactor and the pumping means and between the radio-frequency electrode and the reactor.

As the reactor cavity is made from a conductive material, the latter is advantageously covered by heating or plasma torch projection of a coating 42 not interacting with the plasma and over the entire inner wall thereof. The coating material is e.g. alumina ($Al_2O_3$) with a thickness between 300 and 500 μm. This treatment type for passivating the walls of the cavity with respect to the plasma created therein is e.g. described in French patent application 2 538 987.

Numerous modifications can be made to the apparatus shown in the drawing. Thus, e.g. and as described in French patent application 2 534 040, in certain cases, metal angles or wedges are advantageously added in the vicinity of the cell to the waveguide.

This apparatus consequently makes it possible to etch a substrate with the aid of a plasma produced by the interaction of an appropriate gaseous medium with ultra-high frequency waves and radio-frequency waves. This gaseous medium may or may not circulate in the enclosure via pumping means.

It can also be used for etching a substrate by a gaseous plasma produced solely by ultra-high frequency waves and whilst eliminating the generator 31, etc.

In order to etch a silicon layer through a silicon dioxide mask, the silicon layer covered by its mask is firstly placed on support 7. The pressure is then established in the enclosure at a desired level by pumping means and the gases such as $SF_6$, argon, oxygen and optionally nitrogen at the desired flow rates are introduced into the cell via duct 25, valves 23 and the different bottles or cylinders 21a to 21n. The thus created gaseous medium is then made to interact with ultra-high frequency waves produced by the ultra-high frequency wave generator 27 and introduced into the cell by waveguide 29 and optionally with radio-frequency waves in the vicinity of the radio-frequency electrode 33.

The following examples relating to the etching of polycrystalline silicon are given in a non-limitative manner for illustrating the invention.

EXAMPLE 1

In this example use is made of a gaseous medium formed by sulphur hexafluoride, oxygen and argon for etching by a plasma produced simultaneously by radio-frequencies and ultra-high frequencies with respective powers of 200 and 800W. Circulation takes place in the enclosure of sulphur hexafluoride at a rate of 15 $cm^3$ standard/min, argon at 15 $cm^3$ standard/min and oxygen at 5 $cm^3$ standard/min under a pressure of approximately 1 Pa and a temperature of 80° C. This leads to an etching rate Vg of 8 $\mu m/min$, a selectivity S of 10 and an anisotropy A of $\leq 0.05$.

EXAMPLE 2

This example uses the same gaseous medium as in example 1 and it is made to circulate in the enclosure with the same flow rates, but the plasma is formed solely by ultra-high frequency waves with a power of 800 W. This gives an etching rate Vg of 15 $\mu m/min$, a selectivity S of 64 and an anisotropy A of 0.52.

EXAMPLE 3

This example adopts the same operating procedure as in example 1, except that the respective flow rates of $SF_6$, $O_2$ and Ar are those given in the following table. The results given therein are obtained.

COMPARATIVE EXAMPLE 1

The same operating procedure as in example 3 is used for etching silicon, but using as the gaseous mixture a mixture of $CF_4$, $O_2$ and Ar introduced into the enclosure at a rate of 50 $cm^3$ standard/min for $CF_4$, 10 $cm^3$ standard/min for $O_2$ and 30 $cm^3$ standard/min for Ar. The results obtained are given in the following table.

These results make it clear that the replacement of $SF_6$ by $CF_4$ leads to inferior results. It is assumed that in this case the formation of a stable non-volatile product on the surface of the silicon of the CF type slows down the reaction of the silicon with the fluorine of the discharge and leads to inferior results.

EXAMPLE 4

This example follows the operating procedure of example 1, but uses a gaseous mixture comprising $SF_6$, Ar, $O_2$ and $N_2$. The respective flow rates of the gases are 50 $cm^3$ standard/min for $SF_6$, i.e. a partial pressure of 1.62 Pa (12 mTorr), 30 $cm^3$ s/min for Ar, i.e. a partial pressure of 0.81 Pa (6 mTorr), 10 $cm^3$ s/min for $O_2$, i.e. a partial pressure of 0.27 Pa (2 mTorr), 10 $cm^3$ s/min for $N_2$, i.e. a partial pressure of 0.27 Pa (2 mTorr).

This gives a Si etching rate of 6 $\mu m/min$, a $SiO_2$ mask etching rate of 0.03 $\mu m/min$, a selectivity S of 200 and an alpha angle of 70°.

EXAMPLE 5

The operating procedure of example 4 is adopted with flow rates of 50 $cm^3$ s/min (1.5 Pa) for $SF_6$, 32 $cm^3$ s/min (1 Pa) for Ar, 8 $cm^3$ s/min (0.35 Pa) for $O_2$ and 8 $cm^3$ s/min (0.35 Pa) for $N_2$. Results equivalent to those of example 4 are obtained.

TABLE

| | Example 3 | Comparative Example 1 |
|---|---|---|
| $SF_6$ rate | 50 $cm^3$ s/min | |
| $CF_4$ rate | | 50 $cm^3$ s/min |
| $O_2$ rate | 10 $cm^3$ s/min | 10 $cm^3$ s/min |
| Ar rate | 30 $cm^3$ s/min | 30 $cm^3$ s/min |
| Si etching rate | 4.2 $\mu m/min$ | 0.35 $\mu m/min$ |
| $SiO_2$ etching rate | 0.01 $\mu m/min$ | 0.14 $\mu m/min$ |
| Selectivity S | 420 | 2.5 |
| Homogeneity | Si ± 1.5%; $SiO_2$ ± 1.5% | Si ± 4%; $SiO_2$ ± 11% |
| Anisotropy A | 0.8 | 0.5 |
| Surface roughness | <80 nm | <50 nm |

A description will now be given of an apparatus for performing the process according to the invention in an illustrative, nonlimitative manner with reference to the drawing.

The process according to the invention can be performed in all etching means using a plasma produced by ultra-high frequency waves using the waveguide-gas cell coupling mode (surfaguide) described hereinbefore, provided that use is made of a support able to support the said layer, which is at least in part conductive and optionally a radio-frequency wave generator connected on the one hand to the conductive part of the support and on the other to a counterelectrode connected to earth or conversely the layer on the electrode being connected to earth and the counterelectrode to the radio-frequency generator. This counterelectrode is constituted either by a supplementary electrode located in the enclosure, e.g. round the support, or by at least part of the enclosure, or by at least part of the enclosure and a supplementary electrode.

In certain cases, it is preferable to cool the walls of the enclosure constituting the reactor. The apparatus also comprises appropriate cooling means, e.g. a circulation of water between the wall of cavity 5 and a supplementary wall 45, in order to e.g. keep wall 5 at ambient temperature.

We claim:

1. In a process for etching a substrate with the aid of a gas plasma produced either by ultra-high frequency waves, or by radio-frequency waves and ultra-high frequency waves, the improvement comprising that the gaseous medium used for forming the plasma comprises at least one non-carbon-containing fluorinating gas, at least one rare gas and at least one non-carbon-containing oxidizing gas.

2. Process according to claim 1, characterized in that the gaseous medium also comprises at least one other gas chosen from among nitrogen and chlorine-containing gases.

3. Process according to any one of the claims 1 and 2, characterized in that the non-carbon-containing fluorinating gas is sulphur hexafluoride $SF_6$.

4. Process according to any one of the claims 1 and 2, characterized in that the rare gas is argon or a mixture of argon and helium.

5. Process according to any one of the claims 1 and 2, characterized in that the oxidizing gas is oxygen.

6. Process according to claim 1, characterized in that the gaseous medium is constituted by sulphur hexafluoride, argon and oxygen.

7. Process according to claim 6, characterized in that the respective flow rates of sulphur hexafluoride, argon and oxygen are 4 to 500 $cm^3$ standard/min for $SF_6$, 4 to 500 $cm^3$ standard/min for Ar and 2 to 500 $cm^3$ standard/min for $O_2$.

8. Process according to claim 1, characterized in that the gaseous medium is constituted by sulphur hexafluoride, argon, oxygen and nitrogen.

9. Process according to claim 8, characterized in that the respective flow rates of sulphur hexafluoride, argon, oxygen and nitrogen are 4 to 500 $cm^3$ standard/min for $SF_6$, 4 to 500 $cm^3$ standard/min for Ar, 1 to 300 $cm^3$ standard/min for $O_2$ and 1 to 300 $cm^3$ standard/min for $N_2$.

10. Process according to any one of the claims 1, 2 and 6 to 9, characterized in that the substrate is of silicon.

11. Process according to any one of the claims, 2 and 6 to 9, characterized in that etching is performed under a pressure of 0.1 to 300 Pa.

12. Process according to any one of the claims 1, 2 and 6 to 9, characterized in that etching is carried out by means of a gas plasma produced by ultra-high frequency waves and radio-frequency waves by confining on the substrate by a cell made from a material transparent to ultra-high frequency waves a gas plasma produced by transverse monomode coupling between a waveguide traversed by ultra-high frequency waves and the cell in which at least part of the gaseous etching medium circulates perpendicular to the ultra-high frequency waves to be directed onto the substrate and by simultaneously applying to the substrate a d.c. or a.c. voltage having a frequency in the radio-frequency range.

13. Process according to any one of the claims 1, 2 and 6 to 9, characterized in that etching is carried out by means of a gas plasma produced by ultra-high frequency waves by confining on the substrate using a cell made from a material transparent to ultra-high frequency waves a gas plasma produced by transverse monomode coupling between a waveguide traversed by ultra-high frequency waves and the cell in which at least part of the gaseous etching medium circulates perpendicular to the ultra-high frequency waves to be directed onto the substrate.

* * * * *